United States Patent
Chamberlin et al.

(10) Patent No.: US 6,235,994 B1
(45) Date of Patent: May 22, 2001

(54) THERMAL/ELECTRICAL BREAK FOR PRINTED CIRCUIT BOARDS

(75) Inventors: Bruce J. Chamberlin, Kirkwood, NY (US); Mitchell G. Ferrill, Little Meadows, PA (US); Randall J. Stutzman, Vestal; George H. Thiel, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/106,909

(22) Filed: Jun. 29, 1998

(51) Int. Cl.$^7$ .................................................... H05K 1/00
(52) U.S. Cl. ..................... 174/252; 174/261; 174/260; 174/262; 174/255
(58) Field of Search .................................. 174/252, 250, 174/260, 261, 262, 266; 361/722, 721, 719, 718, 717, 713, 712, 692, 693, 767, 768, 771, 779, 780, 748, 794

(56) References Cited

U.S. PATENT DOCUMENTS

| | | |
|---|---|---|
| 3,528,173 * | 9/1970 | Gall . |
| 3,530,229 * | 9/1970 | Burke, Jr. . |
| 3,564,115 | 2/1971 | Gribble et al. ........................ 174/254 |
| 4,187,388 * | 2/1980 | Roberts . |
| 5,363,280 | 11/1994 | Chobot et al. ........................ 361/794 |
| 5,371,653 | 12/1994 | Kametani et al. .................... 361/721 |
| 5,451,720 * | 9/1995 | Estes et al. . |
| 5,473,813 | 12/1995 | Chobot et al. ........................... 29/837 |
| 5,495,210 | 2/1996 | Forterre et al. ........................ 333/1.1 |
| 5,590,030 | 12/1996 | Kametani et al. .................... 361/794 |

* cited by examiner

Primary Examiner—Jeffrey Gaffin
Assistant Examiner—Kamand Cuneo
(74) Attorney, Agent, or Firm—Connolly Bove Lodge & Hutz, LLP; Lawrence R. Fraley

(57) ABSTRACT

A multi-layer printed circuit board including at least one layer of an electrically conducting material and at least one layer of an electrically insulating material. At least one through hole formed at least through the at least one layer of electrically conducting material. The at least one through hole includes a material plated on an interior surface thereof. At least one thermal break is provided in the at least one layer of electrically conducting material, such that heat passing between the through hole and the at least one layer of electrically conducting material passes through the at least one thermal break. At least one electrical connection provided in the at least one layer of electrically conducting material between the material plated on the interior surface of the through hole and the at least one layer of electrically conducting material. At least a portion of the at least one electrical connection is between the through hole and the at least one thermal break.

24 Claims, 5 Drawing Sheets

THERMAL/ELECTRICAL BREAK FOR PRINTED CIRCUIT BOARDS

FIELD OF THE INVENTION

The present invention relates to multi-layer circuit boards and circuit cards and to controlling heat flow through the circuit boards and circuit cards. More particularly, the present invention relates to a thermal and/or electrical break for circuit boards and circuit cards.

BACKGROUND OF THE INVENTION

During assembly and rework of a circuit board, the process of removing components from and reattaching components to a circuit board, a proper temperature should be maintained to permit the solder to reach and remain at its reflow temperature. For this to occur, the applied heat must be prevented from dissipating through the circuit board to adjacent components where the heat can cause potentially damaging stress to the circuit board or card and attached components.

It is common to mount complex electronic components on printed boards by inserting pins extending from components into plated through holes in the circuit board and soldering them in place. The plated through holes normally provide connections between the pins and conductive material situated at various levels of the circuit board or card.

As the number of components attached to the circuit board increases, both the number of pins and the number of times the board must be heated to solder the pins in place may increase. Therefore, during assembly and/or rework, a great amount of heat is potentially applied to a circuit board or card.

As the circuit board increases in size and thickness, the total amount of copper and the number of planes common to a single via all contribute to insufficient soldering and the inability to assemble and/or rework a component. Further, the soldering process is adversely affected when tied planes in a circuit board or circuit card, that is, planes in the circuit board or card that are electrically connected to the through hole, allow heat being applied to the plated through hole to escape into the internal planes of the circuit board. The escape of heat from the through hole reduces the through hole temperature to below the solder melting point resulting in insufficient hole fill.

The draining of heat from the through hole is especially prevalent when two or more planes are common to a single through hole. This allows heat to escape into the internal planes of the circuit board or circuit card from the plated through hole, thereby inhibiting the top surface of the carrier from reaching the solder reflow temperature. Thicker circuit boards and circuit cards that do not have common power planes may also experience assembly and/or rework problems. It may be essential that when heat is applied to the circuit board during assembly and/or rework that the temperature not be such that it could melt, burn, or char material used to form the circuit board or circuit card. However, enough heat must be applied to the solder to cause the solder to melt throughout the length of the plated through hole.

Figure 1:
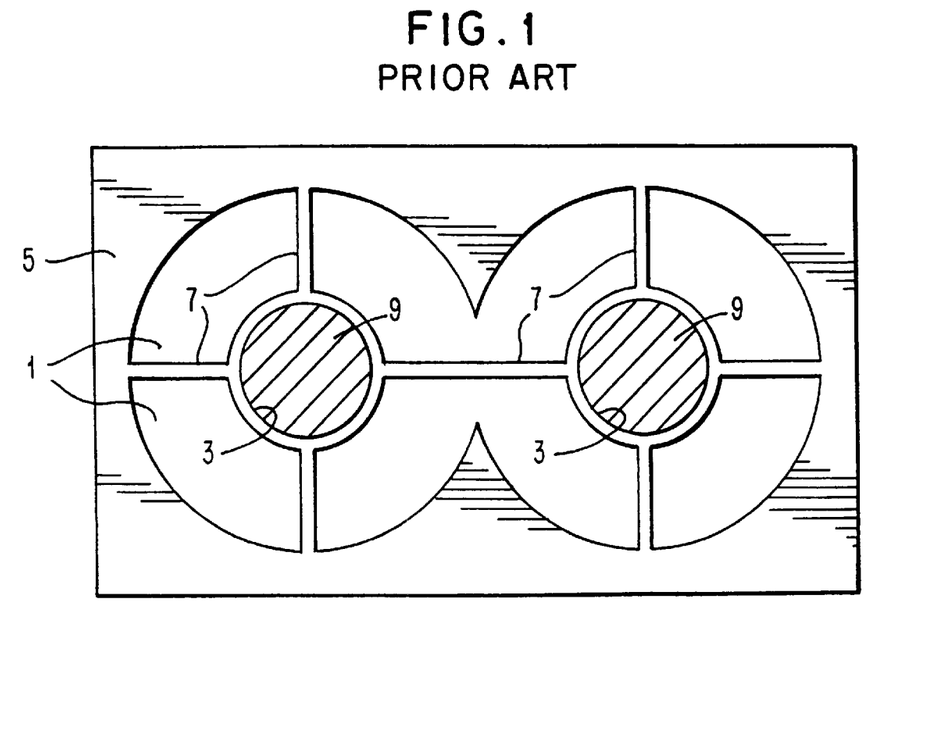
FIG. 1 represents an embodiment of a known thermal break design.

FIG. 1 illustrates a known thermal break design that may be used in the connection of plated through holes to power and ground planes in circuit boards and circuit cards to permit electrical connection between the planes and the plated through hole and minimize thermal conduction of heat during assembly and/or rework operations. The thermal break shown in FIG. 1 includes 4 spokes extending through the thermal break to electrically connect the plated through hole to power/ground planes. To be thermally effective, the spokes preferably are long, thus requiring a large area around the plate through hole or the thermal break.

SUMMARY OF THE INVENTION

An advantage of the present invention is that it provides a long thermal path in a thermal break while minimizing the area taken up by the thermal break.

Another advantage of the present invention is that it enhances thermal benefits while reducing the impact on the electrical performance of signal lines adjacent to plated through holes.

An additional advantage of the present invention is that it minimizes the amount of materials removed around plated through holes.

Furthermore, the present invention may maximize the electrical path length from the plated through holes to power/ground planes.

In accordance with these and other advantages and objectives, the present invention provides a multi-layer printed circuit board or circuit card including at least one layer of an electrically conducting material and at least one layer of an electrically insulating material. At least one through hole is formed at least through the at least one layer of electrically conducting material of the circuit board or circuit card. The at least one through hole includes a material plated on an interior surface thereof. At least one thermal break is provided in the at least one layer of electrically conducting material. The at least one thermal break is provided such that heat passing between the through hole and the at least one layer of electrically conducting material passes through the at least one thermal break. At least one electrical connection is provided in the at least one layer of electrically conducting material between the material plated on the interior surface of the through hole and the at least one layer of electrically conducting material. Also, at least a portion of the at least one electrical connection is between the through hole and the at least one thermal break.

Other aspects of the present invention provide electronic packages. The packages include a multi-layer printed circuit board including at least one layer of an electrically conducting and at least one layer of an electrically insulating material. At least one through hole is formed at least through the at least one layer of electrically conducting material. The at least one through hole includes a material plated on an interior surface thereof. At least one thermal break is provided in the at least one layer of electrically conducting material, such that heat passing between the through hole and the at least one layer of electrically conducting material passes through the at least one thermal break. At least one electrical connection is provided in provided in the at least one layer of electrically conducting material between the material plated on the interior surface of the through hole and the at least one layer of electrically conducting material. At least a portion of the at least one electrical connection is between the through hole and the at least one thermal break. The package also includes at least one component attached to the circuit board. The component includes at least one pin arranged in and joined to the at least one through hole.

Aspects of the present invention also provide methods for assembly and/or rework of multi-layer circuit boards and electronic packages described above.

Still other objects and advantages of the present invention will become readily apparent by those skilled in the art from the following detailed description, wherein it is shown and described only the preferred embodiments of the present invention, simply by way of illustration of the best mode contemplated of carrying out the invention. As will be realized the present invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

The above objects and advantages of the present invention will be more clearly understood when considered in conjunction with the accompanying drawings, in which.

DETAILED DESCRIPTION OF THE INVENTION

Multi-layer circuit boards and cards are formed from alternating layers of electrically conductive material and electrically insulating material. A number of holes, which extend completely through a circuit board or which may only partially penetrate a circuit board, may be formed for connecting integrated circuits and various other components to the circuit boards and cards. The components may have pins extending from their surface which are inserted into the holes in the circuit board or card.

The holes may be coated, or plated, with electrically conductive material which is functionally connected to the component. Such holes are often referred to as plated through holes. The plating material on the inside of the holes may be selectively connected to the layers of the circuit board or card.

Components are usually assembled to a circuit board or card by causing the molten soldering material to completely fill the plated through holes to a functional and secure connection with the component. However, during this process, the heat in the soldering material can dissipate through the circuit board or card, causing the soldering material to solidify before it completely fills the plated through holes. An additional problem associated with reworking processes is that when the heat dissipates away from the plated through holes, it is not available to melt the soldering material in the through hole.

The present invention provides a solution to the thermal management problems known to exist in circuit board and card assembly and/or rework processes. Accordingly, the present invention provides means to prevent the dissipation of heat throughout the rest of the circuit board or card.

FIG. 1 illustrates an embodiment of a known thermal break design. The design shown in FIG. 1 includes four thermal breaks 1 arranged around each plated through hole 3. The plated through holes are electrically connected to the plane 5 of electrically conducting material through spokes 7. As seen in FIG. 1, the spokes 7 are radial.

The thermal breaks may be filled with a dielectric material. The spokes 7 may be made of the same electrically conducting material as the layer 5 of electrically conducting material that the thermal break is located in. In the embodiment shown in FIG. 1, the electrically conducting layer and the spokes are made of copper, although other electrically conducting materials can be used.

Figure 1A:
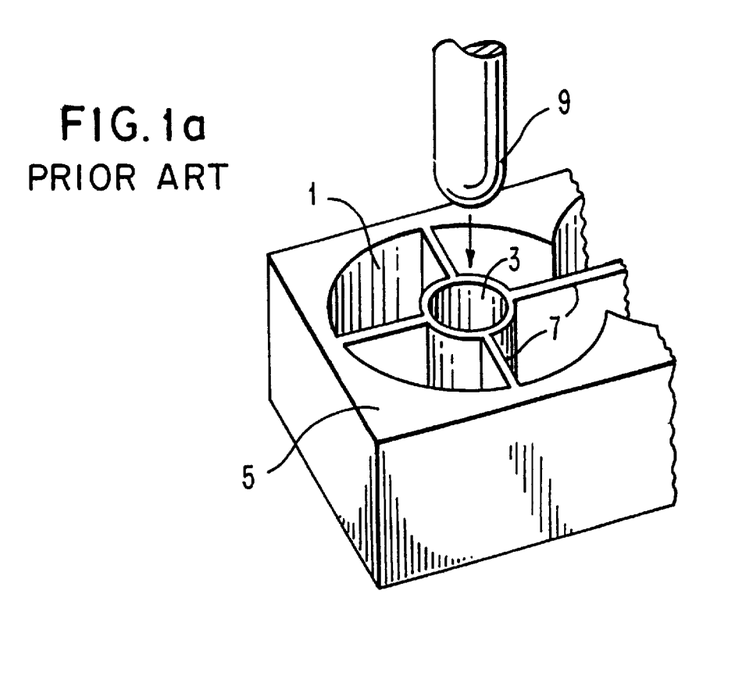
FIG. 1a represents a perspective view of the embodiment shown in FIG. 1.

FIG. 1a provides a perspective view illustrating a portion of a circuit board that includes the thermal break design illustrated in FIG. 1. FIG. 1a illustrates a pin being lowered into the through hole 3. The pin 9 is attached to a component.

To be thermally effective, the spokes 7 illustrated in FIG. 1 and in FIG. 1a preferably are long. These long spokes occupy a large area around the plated through hole for the thermal break.

One example of such known thermal breaks is illustrated in U.S. Pat. No. 5,473,813 assigned to the assignee of the present application, the entire disclosure of which is hereby incorporated by reference.

The present invention overcomes the above described problems related to the thermal break design shown in FIG. 1 and FIG. 1a by providing at least one thermal break arranged about one through hole and provided in at least one layer of a multi-layer circuit board, such that heat passing between the through hole and the layer of electrically conducting material passes through the thermal break.

Additionally, the present invention provides at least one electrical connection between plating material on a plated through hole and a layer of electrically conducting material in which the at least one thermal break is located. At least a portion of the at least one electrical connection between the plated through hole and the electrically conducting layer is arranged between at least a portion of the least one thermal break and the plated through hole. It follows that at least a portion of the at least one thermal break is arranged between at least a portion of the at least one electrical connection and the electrically conducting layer.

Accordingly, the present invention provides a unique design for a thermal break that provides a long thermal path and minimizes the area occupied in layers where the thermal break is located. Along these lines, the present invention provides a structure that minimizes the amount of electrically conducting material that must be removed from a layer of electrically conducting material. For example, as compared to known thermal breaks, such as the design shown in FIG. 1, the present invention minimizes the amount of copper removed in an electrically conductive layer made of copper. Reducing the amount of electrically conducting material removed around a plated through hole may lower the impact to the signal line performance.

The present invention also greatly enhances thermal benefits and reduces the impact upon electrical performance of signal lines located adjacent to plated through holes. The embodiments in FIG. 4 may reduce spinning of inner land paths through which the holes are drilled through a circuit board.

The present invention provides a thermal break for controlling the flow of heat in a multi-layer circuit board. The present invention may be utilized in any multi-layer circuit board that includes at least one layer or plane of an electrically conducting material. The electrically conducting material may be any suitable electrical conducting material. As such, the electrically conducting material may include a single metal, such as copper, or any other single metal. In addition or in place of one metal, the electrically conducting material may include any alloy of metals.

The multi-layer circuit board also includes at least one layer of an electrically insulating material. Any electrically insulating material may be utilized. For example, any known dielectric material commonly utilized in semiconductor applications may be used.

Figure 5:
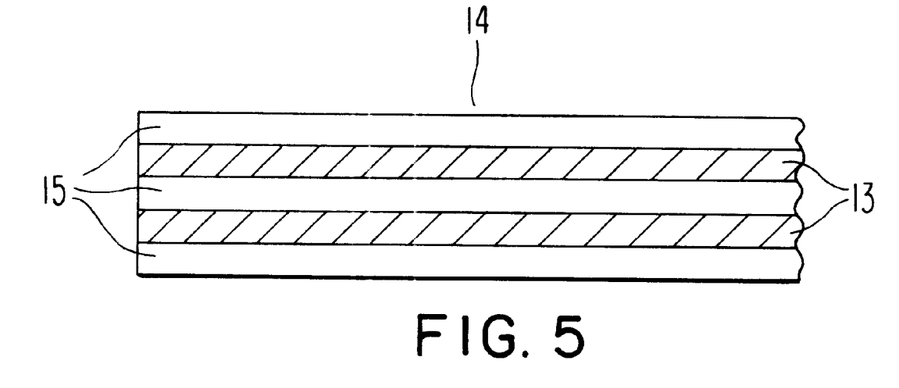
FIG. 5 illustrates a side view of an embodiment of a multi-layer circuit board.

Referring now to FIG. 5, if the multi-layer circuit board 14 includes more than one layer of an electrically conducting material 15 and/or more than one layer of an electrically insulating material 13, the layers of electrically insulating material 13 and electrically conducting material 15 are alternated.

At least one hole is formed in the at least one layer of an electrically conducting material. The at least one through hole may include at least one material on an interior surface thereof. The material may be plated or otherwise deposited on the interior surface thereof. Typically, the material on the interior surface of the through hole is electrically conducting. Any electrically conducting material may be used as described above in relation to the at least one layer of electrically conducting material in the circuit board. The material on the interior surface of the through hole may be electrically connected to the electrically conducting material of the at least one layer of electrically conducting material of the multi-layer circuit board.

The through hole is provided in the multi-layer circuit board to receive a pin extending from a component to be attached to the circuit board. Examples of components include modules, chips, chip supports, and other components.

Components, such as modules, are typically secured to circuit boards or circuit cards by inserting pins attached to the components into through holes in a circuit board. The soldering material is heated to a temperature at which the material will flow and form, upon solidification, a functional and secure connection between the pin and the through hole, and hence the circuit board or circuit card.

However, during the process of soldering the pin in the through holes, heat that should be heating the soldering material in the through hole can dissipate through the circuit board or circuit card, causing the soldering material to solidify before it completely fills the plated through hole. An additional problem associated with reworking processes is that when heat dissipates away from the plated through hole, it is not available to melt the soldering material in the through hole. Thus, both electrical and physical connections between the pin and the circuit board may be less than optimal. Of course, less than optimal connections can lead to faulty, mis-functioning, and/or non-functioning circuit boards and components, and/or failure of connections between pins and circuit boards.

The present inventions provides a solution to thermal management problems known to exist in circuit board and circuit card rework processes. Accordingly, the present invention provides means to prevent heat needed by the assembly and/or rework processes from dissipating away from components being attached to the circuit board or circuit card.

Some through holes in the circuit board or circuit card may not be plated. Additionally, some of the through holes may extend only through certain layers of the circuit board or circuit card. Furthermore, pins extending from components to be attached to the circuit board or circuit card may be inserted in any type of hole, whether plated or not and whether or not they extend entirely through the circuit board or circuit card.

As stated above, to control dissipation of heat between the through hole and one or more layers of the multi-layer circuit board or circuit card, the present invention includes at least one thermal break provided in at least (in the) one layer of electrically conducting material in the multi-layer circuit board or circuit card. The at least one thermal break may be curvilinear in shape. Alternatively, the at least one thermal break may be comprised of the plurality of curvilinear and/or straight segments.

FIG. 2 illustrates one embodiment of the present invention that includes a single thermal break. The thermal break illustrated in FIG. 2a extends almost twice around the circumference of the plated through hole. The through hole illustrated in FIG. 2a is not readily discernable in this view because FIG. 2a is intended to illustrate a condition in which a pin attached to a component is in place in the through hole.

Figure 2A:
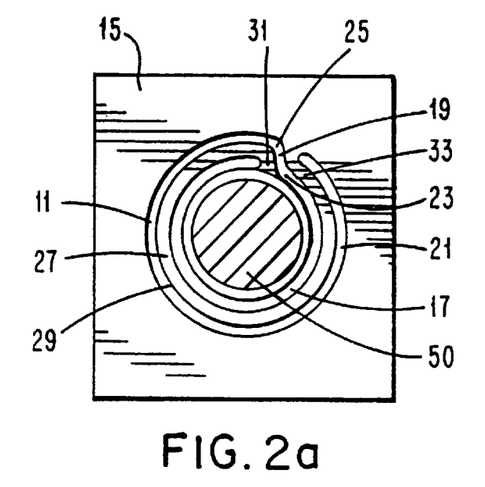
FIGS. 2a through 2d represent various embodiments of thermal break designs according to the present invention, wherein a pin connected to a component has been arranged in the plated through hole associated with the thermal breaks.

The thermal break illustrated in FIG. 2a includes a first curvilinear portion 17 that extends almost entirely around the through hole. The thermal break illustrated in FIG. 2a also includes a second curvilinear portion 21 that also extends almost entirely around the through hole. The two curvilinear portions are connected by a shorter connecting section 19. The free ends of the thermal break illustrated in FIG. 2a are rounded.

The connecting section illustrated in FIG. 2a is curvilinear. The connecting section is connected to the first curvilinear section 17 through an angled connection 23. On the other hand, connecting section 19 is connected to second curvilinear section 21 through a curved connection 25.

Of course, as discussed in greater detail below, the curvature, number of sections, shape of the free ends, number of thermal breaks, configuration of any connecting sections, and all other variables related to the thermal breaks may vary. Such variables may be altered without departing from the concept of the present invention. A curvilinear thermal break may minimize the amount of electrically conducting material removed from the layer of electrically conducting material.

A thermal break according to the present invention may be filled with an electrically insulating material, such as any common dielectric typically used in semiconductor applications. Alternatively, the thermal break may be an empty space. A thermal break according to the present invention may be formed utilizing typical photolithographic techniques.

Figure 2B:
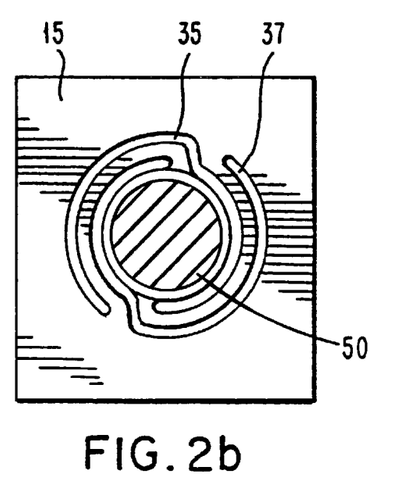
Figure 2C:
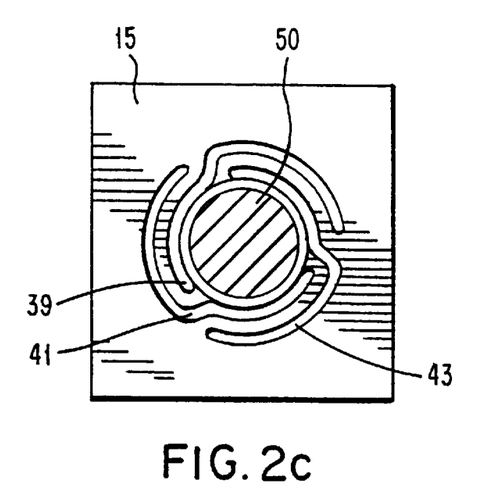
Figure 2D:
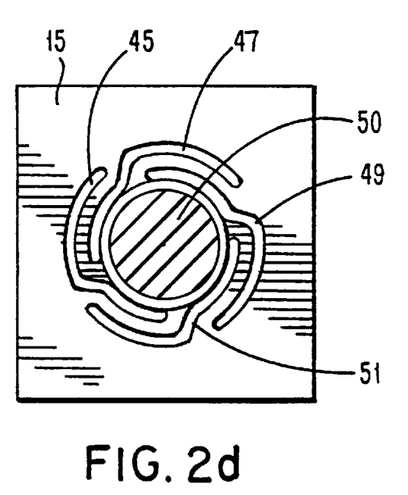

FIG. 2b, FIG. 2c and FIG. 2d illustrate alternative embodiments of the present invention and include, respectively, two, three and four thermal breaks. The thermal breaks illustrated in FIG. 2b, FIG. 2c and FIG. 2d, do not extend entirely around the through hole more than once as in the embodiment shown in FIG. 2a. However, each of the thermal breaks illustrated in FIG. 2b, FIG. 2c and FIG. 2d, include two curvilinear sections connected by at least one connecting section as in the embodiment shown in FIG. 2a.

Regardless of whether the thermal break of the present invention is entirely curvilinear, or curvilinear at all or include one, two, three, four or more individual thermal breaks, the thermal break or breaks preferable are configured such that a line extending from the center of the through hole must pass through at least a portion of at least one of the thermal breaks. Therefore, heat passing between the through hole and the plane electrically conducting material must pass through the thermal break or breaks.

Figure 3:
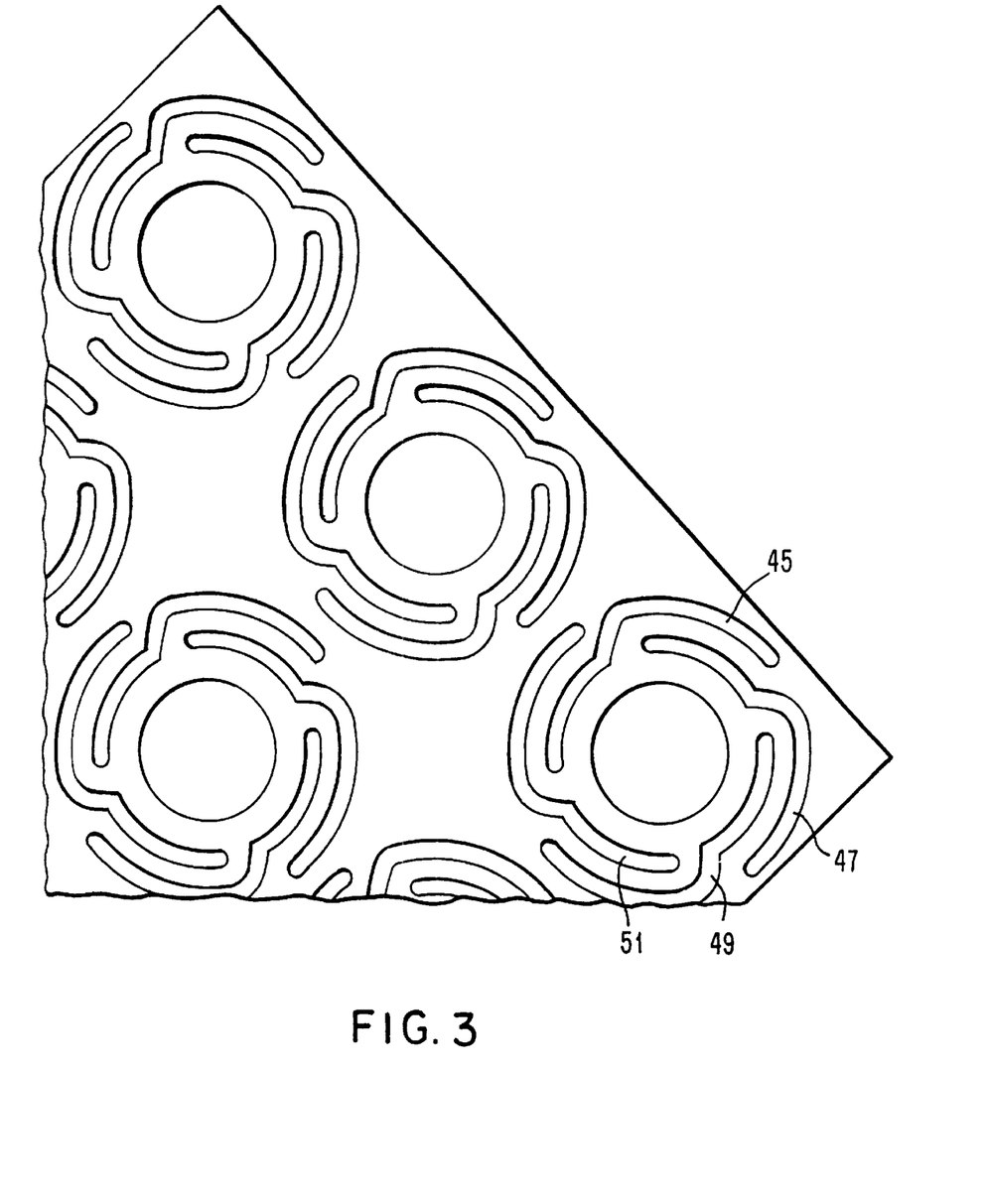
FIG. 3 represents an embodiment of a layer of a circuit board or circuit card according to the present invention including the embodiment of the thermal break design shown in FIG. 2d, wherein pins have not been placed in the plated through holes.
Figure 4:
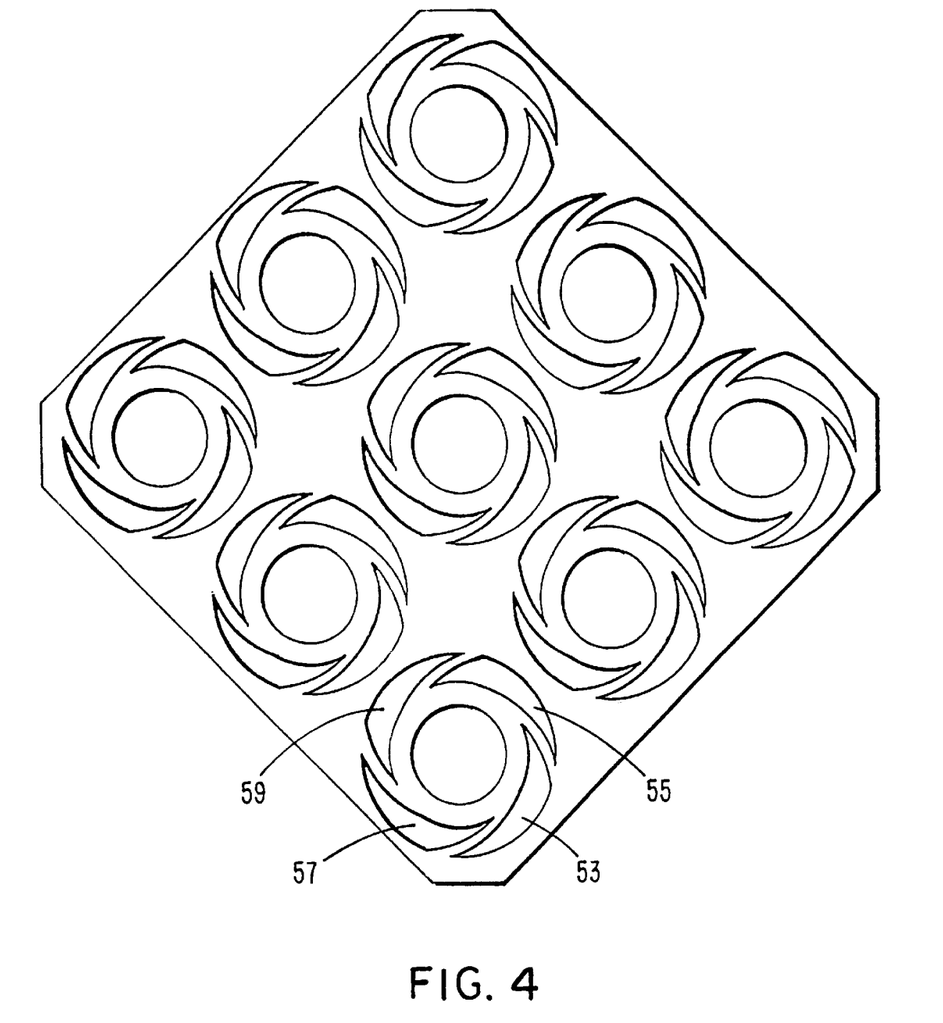
FIG. 4 represents another embodiment of a thermal break according to the present invention.

As can be seen in FIG. 2b, FIG. 2c, FIG. 2d and FIG. 4, the present invention may include a plurality of thermal breaks 35 and 37; 39, 41, and 43; 45, 47, 49, and 51; and 53, 55, 57, and 59, respectively, symmetrically and concentrically arranged about a through hole. The thermal breaks need not be symmetrically or concentrically arranged. In FIGS. 2a–2d, a pin 50 is arranged in the through hole. On the other hand, FIGS. 3 and 4 illustrate an empty through hole. The boundary between the pin and the soldering material exists in FIGS. 2a–2d in substantially a similar position as the edge of the material in the through hole shown in FIGS. 3 and 4, but is not easily visible in FIGS. 2a–2d.

FIG. 4 illustrates an embodiment of the present invention and includes thermal breaks that are substantially crescent shaped. Although, the thermal breaks illustrated in FIG. 4 include an apex. An alternative way of thinking of the shape of the leaves of a diaphragm of a camera partially closed.

Whether the present invention includes one, two, three, four, or more thermal breaks, to ensure that heat passing between the through hole and the plane of electrically conducting material passes through the thermal break, it may be necessary for at least a portion of at least one of the thermal breaks to be arranged between at least a portion of another of the thermal breaks and the through hole. This is clearly illustrated in FIG. 2a, FIG. 2b, FIG. 2c, FIG. 2d, FIG. 3, and FIG. 4 wherein this condition exists. Although, in FIG. 2a, it is a portion of the one single break that lies between other portions of the one thermal break and the through hole. The thermal breaks need not overlap, but could terminate at one line such that they still surround a through hole.

The present invention also includes at least one electrical connection in the at least one layer of electrically conducting material providing an electrical connection between the material on the interior surface of the through hole and at least one layer of electrically conducting material. The at least one electrical connection is arranged such that at least a portion of the at least one electrical connection is arranged between the through hole and at least a portion of the at least one thermal break.

In the embodiment shown in FIG. 2a, the at least one electrical connection 27 spirals around the through hole between the portions of the thermal break 11. Therefore, the at least one electrical connection has a shape complementary to the shape of the thermal break. As such, the electrical connection includes a circular portion 29 and two connecting portions 31 and 33 connecting the electrical connection to the through hole and the at least one layer of electrically conducting material 15, respectively.

As with the thermal breaks, the present invention may include a plurality of electrical connections as illustrated in FIG. 2b, FIG. 2c, FIG. 2d, and FIG. 4. The shape, configuration, and arrangement of the electrical connection(s) is/are interrelated to the shape, configuration, and arrangement of the at least one thermal break. Typically, the electrical connection(s) is/are made from the same material as the electrically conducting material. The discussion above regarding the number of segments and shapes of the segments of the thermal break(s) applies to the electrical connection(s), as well.

The present invention provides a solution to heat management problems during assembly and/or rework in multi-layer printed circuit boards and circuit cards. The present invention permits increased density of components while providing a thermal break design that accommodates the thermal management problems. As such, the present invention helps to prevent transferring of heat into a circuit board while permitting the soldering material in the through hole to be heated and the component to be attached. The present invention increases the thermal path without increasing space requirements and/or actually reducing space requirements as compared to known thermal break designs.

The present invention also provides an electronic package that includes a multi-layer printed circuit board or circuit including at least one thermal break and at least one electrical connection, all as described above. The electronic package also includes at least one component attached to the printed circuit board or circuit card. The component includes at least one pin arranged in and joined to the least one through hole in the circuit board or circuit card.

The present invention also provides methods for assembling multi-layer circuit boards and electronic packages as described above. According to the method, at least one layer of at least one electrically conducting material is provided. The at least one layer of at least one electrically insulating material and at least one layer conducting material are joined.

At least one through hole is formed at least through the at least one layer of electrically conducting material. A material is deposited on an interior surface of at least one through hole. At least one thermal break is formed in the least one layer of electrically conducted material, such that heat passing between the through hole and the least one layer of electrically conducting material passes through the at least one thermal break. At least one electrical connection is formed in the at least one layer of electrically conducting material between the material plated on the interior surface of the through hole and the at least one layer of electrically conducted material. At least a portion of the least one electrical connection is arranged between the through hole and the at least one thermal break. As discussed above, the circuit board may include a plurality of layers of electrically conducting and electrically insulating material, through holes, thermal breaks, and/or electrical connections.

According to methods for forming an electronic package, after a circuit board is formed as described above, at least one pin attached to the component to be attached to the circuit board is placed into at least one through hole. The pin is secured to the through hole. The pin may be secured by heating the soldering material inside the at least one through hole to a temperature at which the material flows. The material is then cooled. If the circuit board includes a plurality of through holes, a plurality of pins attached to at least one component may be inserted into at least selected ones of the through holes.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A multi-layer printed circuit board, comprising:
   an electrically conducting layer;
   an electrically insulating layer;
   a through hole formed through said electrically conducting layer, said through hole including a conductive material plated on an interior surface thereof;
   a thermal break provided in said electrically conducting layer and circumscribing said through hole, such that heat passing between said through hole and said electrically conducting layer passes through said thermal break; and
   an electrical connection provided in the place of said electrically conducting layer between said conductive material and said electrically conducting layer, wherein at least a portion of said electrical connection is formed between said through hole and said thermal break.

2. The multi-layer printed circuit board according to claim 1, further comprising:
   a plurality of thermal breaks symmetrically concentrically arranged about said through hole wherein said plurality of thermal breaks together circumscribe said through hole.

3. The multi-layer printed circuit board according to claim 2, wherein at least a portion of two thermal breaks are arranged between said electrically conducting layer and said through hole.

4. The multi-layer printed circuit board according to claim 1, wherein said thermal break includes a plurality of interconnected segments.

5. The multi-layer printed circuit board according to claim 4, wherein some of said segments are not concentric with said through hole.

6. The multi-layer printed circuit board according to claim 1, further comprising:
   a plurality of electrically conducting layers; and
   a plurality of electrically insulating layers,
   wherein said electrically conducting layers and said electrically insulating layers are alternately arranged.

7. The multi-layer printed circuit board according to claim 1, wherein said through hole extends through said electrically insulating layer.

8. The multi-layer printed circuit board according to claim 1, further comprising:
   a plurality of electrical connections between said conductive material and said electrically conducting layer that are concentrically arranged about said through hole.

9. The multi-layer printed circuit board according to claim 1, wherein said thermal break is crescent shaped.

10. The multi-layer printed circuit board according to claim 6, wherein a number of said electrically conducting layers have thermal breaks formed thereon.

11. The multi-layer printed circuit board according to claim 6, wherein a number of said electrically conducting layers are electrically connected to said conductive material.

12. The multi-layer printed circuit board according to claim 1, wherein said through hole is formed to receive a pin of a component attached to the circuit board.

13. The multi-layer printed circuit board according to claim 2, wherein the plurality of thermal breaks consists of two thermal breaks.

14. The multi-layer printed circuit board according to claim 2, wherein the plurality of thermal breaks consists of three thermal breaks.

15. The multi-layer printed circuit board according to claim 2, wherein the plurality of thermal breaks consists of four thermal breaks.

16. The multi-layer printed circuit board according to claim 6, including a plurality of through holes wherein said thermal breaks are provided in a number of layers of said plurality of electrically conducting layers about another number of said through holes.

17. The multi-layer printed circuit board according to claim 1, wherein said thermal break is hollow.

18. The multi-layer printed circuit board according to claim 1, wherein said thermal break is filled with an electrically insulating material.

19. The multi-layer printed circuit board according to claim 1, wherein said thermal break extends entirely around said through hole more than one time such that at least one portion of said at break is arranged between said through hole and at least one other portion of said thermal break.

20. The multi-layer printed circuit board according to claim 1, wherein said thermal break and said electrical connection are curvilinear.

21. An electronic package, comprising:
   a multi-layer printed circuit board including an electrically conducting layer, an electrically insulating layer, a through hole formed through said electrically conducting layer and said electrically insulating layer, said through hole including a conductive material plated on an interior surface thereof, a thermal break provided in said electrically conducting layer and circumscribing said through hole, such that heat passing between said through hole and said electrically conducting layer passes through said thermal break, an electrical connection provided in the plane of said electrically conducting layer between said conductive material and said electrically conducting layer, wherein at least a portion of said electrical connection is formed between said through hole and said thermal break; and
   a component attached to said circuit board, said component including a pin arranged in and joined to said through hole.

22. A method of forming a multi-layer circuit board, said method comprising the steps of:
   providing an electrically conducting layer;
   providing an electrically insulating layer;
   forming a through hole in said electrically conducting layer and said electrically insulating layer;
   depositing a conductive material on an interior surface of said through hole;
   forming a thermal break in said electrically conducting layer that circumscribes said through hole, such that heat passing between said through hole and said electrically conducting layer passes through said thermal break; and
   forming an electrical connection in the plane of said electrically conducting layer between said conductive material and said electrically conducting layer, wherein at least a portion of said electrical connection is formed between said through hole and said thermal break.

23. A method of forming an electronic package, said method comprising the steps of:
   providing an electrically conducting layer;
   providing an electrically insulating layer;

forming a through hole in said electrically conducting layer and said electrically insulating layer;

depositing a conductive material on an interior surface of said through hole;

forming a thermal break in said electrically conducting layer that circumscribes said through hole, such that heat passing between said through hole and said electrically conducting layer passes through said thermal break;

forming an electrical connection in the plane of said electrically conducting layer said conductive material and said electrically conducting layer, wherein at least a portion of said electrical connection is formed between said through hole and said thermal break;

placing a pin attached to a component into said through hole; and securing said pin in said through hole.

24. The method according to claim 23, wherein said pin is secured by heating soldering material inside of said through hole to a temperature at which said soldering material flows and then cooling said soldering material.

* * * * *